(12) United States Patent
Mecklenburg

(10) Patent No.: US 9,457,408 B2
(45) Date of Patent: Oct. 4, 2016

(54) INDEXABLE INSERT, AND METHOD FOR THE PRODUCTION THEREOF

(75) Inventor: Arno Mecklenburg, Berlin (DE)

(73) Assignee: MSM Krystall GbR, Berlin (DE)

( * ) Notice: Subject to any disclaimer, the term of this patent is extended or adjusted under 35 U.S.C. 154(b) by 572 days.

(21) Appl. No.: 13/878,268

(22) PCT Filed: Oct. 4, 2011

(86) PCT No.: PCT/DE2011/050038
§ 371 (c)(1),
(2), (4) Date: Aug. 13, 2013

(87) PCT Pub. No.: WO2012/048692
PCT Pub. Date: Apr. 19, 2012

(65) Prior Publication Data
US 2013/0330137 A1 Dec. 12, 2013

(30) Foreign Application Priority Data
Oct. 8, 2010 (DE) .................. 10 2010 038 077

(51) Int. Cl.
B23B 27/14 (2006.01)
C23C 14/04 (2006.01)
C23C 28/04 (2006.01)
C23C 28/00 (2006.01)

(52) U.S. Cl.
CPC ............. *B23B 27/148* (2013.01); *C23C 14/04* (2013.01); *C23C 28/044* (2013.01); *C23C 28/046* (2013.01); *C23C 28/048* (2013.01); *C23C 28/42* (2013.01); *Y10T 407/23* (2015.01)

(58) Field of Classification Search
USPC .......... 51/307, 309; 428/332, 469, 472, 697, 428/698, 699; 407/119; 204/192.15, 192.16
See application file for complete search history.

(56) References Cited

U.S. PATENT DOCUMENTS

| | | | | |
|---|---|---|---|---|
| 4,610,931 A | * | 9/1986 | Nemeth | C22C 29/04 75/240 |
| 4,950,557 A | * | 8/1990 | Nakai | B23K 31/025 428/697 |
| 5,135,807 A | * | 8/1992 | Ito | C23C 14/0605 428/408 |
| 6,410,153 B1 | * | 6/2002 | Broomfield | C22C 19/057 428/469 |
| 6,858,333 B2 | * | 2/2005 | Henderer | C23C 30/005 407/119 |
| 8,388,890 B2 | * | 3/2013 | Hilty | C22C 19/03 428/680 |

FOREIGN PATENT DOCUMENTS

| JP | 08-039132 | * | 2/1997 |
|---|---|---|---|
| JP | 2007-056323 | * | 3/2007 |

OTHER PUBLICATIONS

Irei et al "Depostion of NITiN nano-compositw films bt cathodic arc ion-plating" Nuclear Instruments $ Mehtods in Physics Research B 121 (1997) p. 1330136.*

* cited by examiner

*Primary Examiner* — Archene Turner
(74) *Attorney, Agent, or Firm* — Laurence A. Greenberg; Werner H. Stemer; Ralph E. Locher

(57) ABSTRACT

One example of the invention relates to an indexable insert comprising a base that has flanks and at least one face. According to one example of the invention, primarily the face(s) of the indexable insert, but not the flanks thereof, are coated with a very thick layer (e.g. thicker than 50 μm) of a hard material in a PVD process.

42 Claims, 3 Drawing Sheets

FIG 1 Section A-A
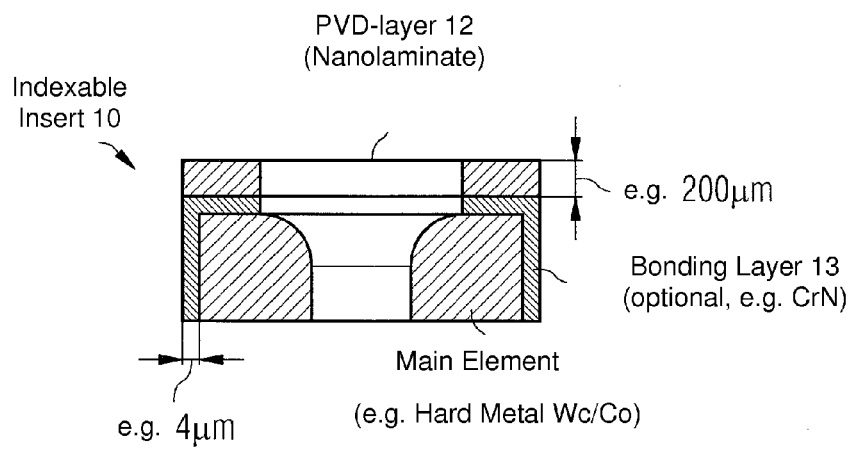
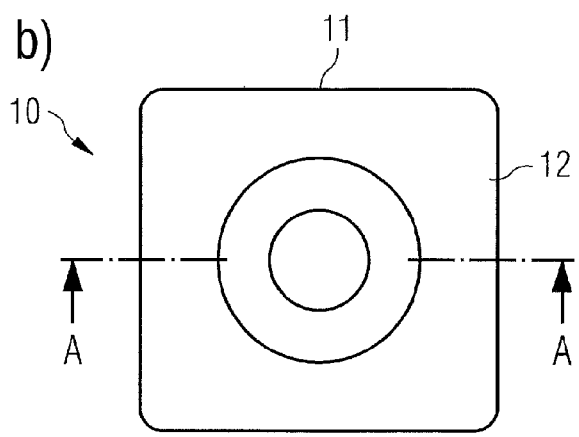
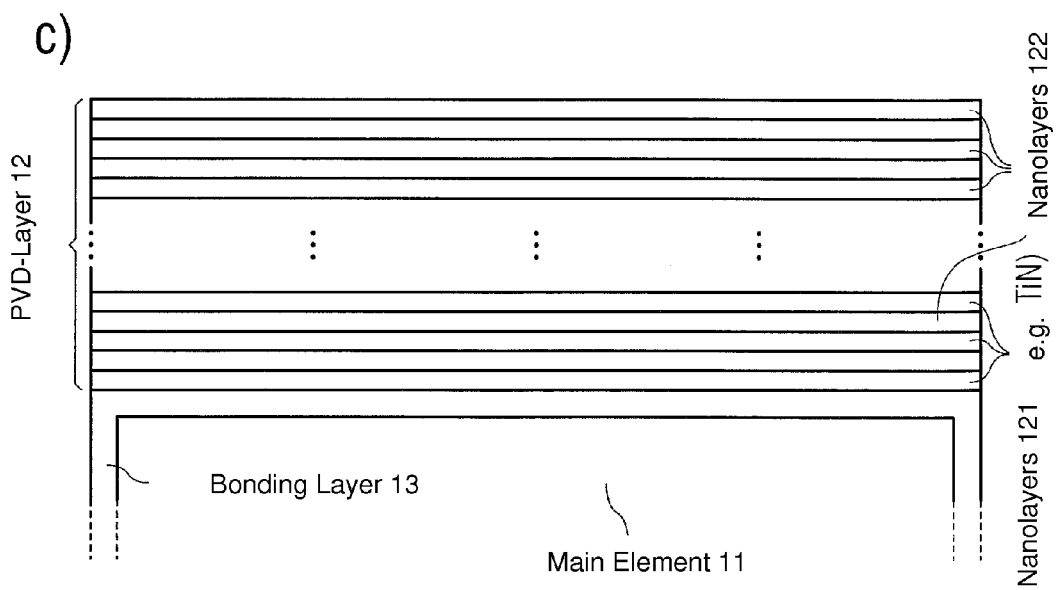

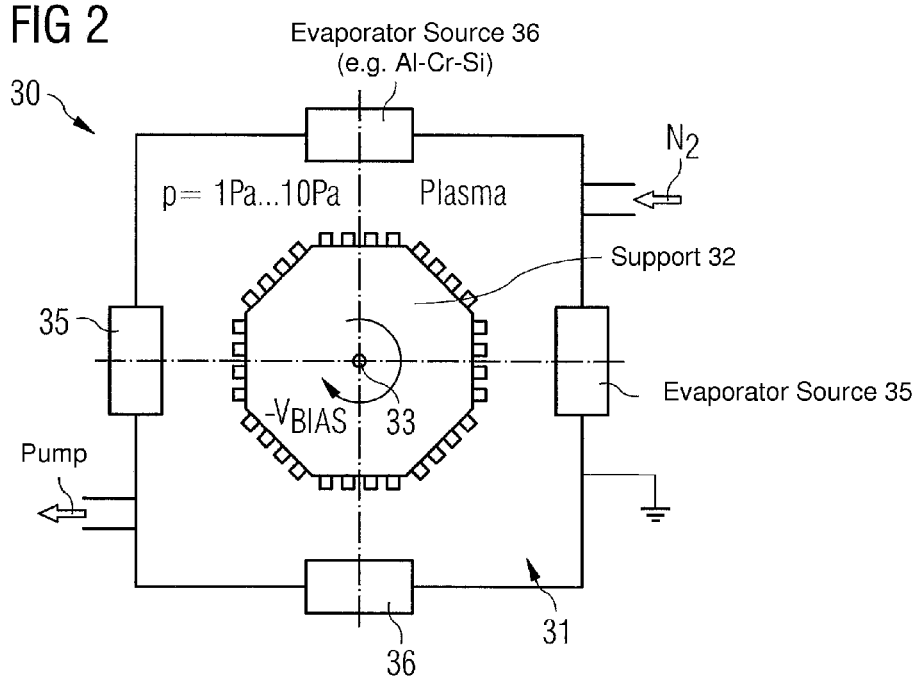
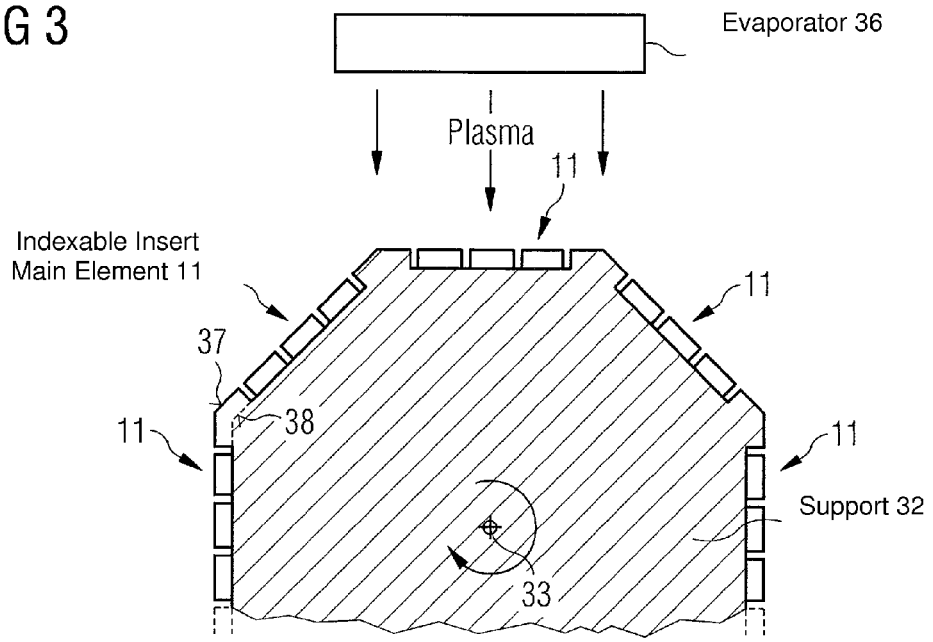

FIG 4
a)
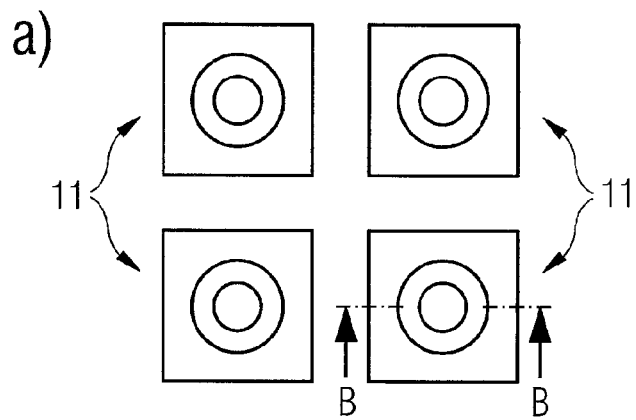
b) Section B-B (according to PDV Process)
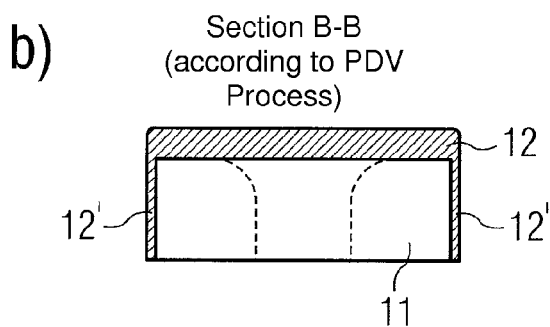
c) Section B-B   Free Surfaces Cut
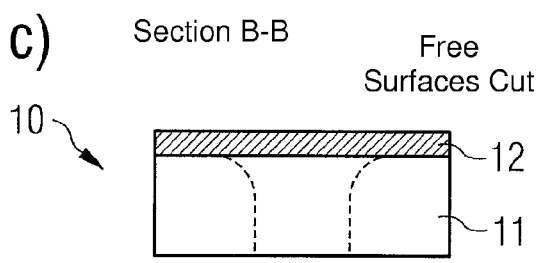
d)
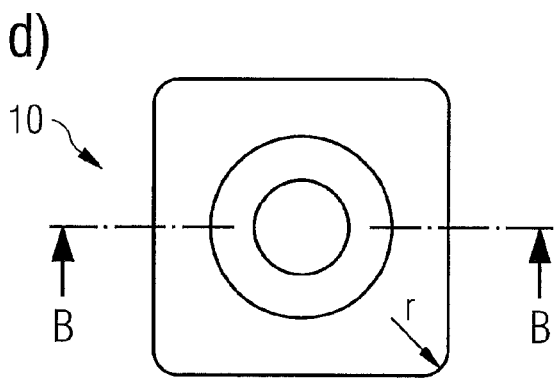

… (1) …

INDEXABLE INSERT, AND METHOD FOR THE PRODUCTION THEREOF

TECHNICAL FIELD

The invention relates to a process for producing indexable inserts by physical vapor deposition (PVD for short).

BACKGROUND OF THE INVENTION

Field of the Invention

Indexable inserts whose cutting edges consist of polycrystalline diamond (PCD) or (usually ceramically bonded) cubic crystalline boron nitride (CBN) are generally known for hard machining (cutting machining of hardened materials having a hardness of, for example, from 54 to 62 HRC). To produce the indexable inserts, cutting tips composed of PCD or CBN are produced and fastened to a main element, for example by vacuum soldering. Main elements made of cemented hard material are usual. PCD and CBN are among the hardest known materials. They have not only a high hardness but also very high thermal conductivities combined with low coefficients of thermal expansion. However, they also have various disadvantages which greatly restrict the field of use of PCD and CBN cutting tips. Mention may be made of, for example, the high brittleness of these materials, because of which they can be used only for continuous cutting. Although PCD is harder than CBN, it has poor suitability, or is not usable at all, for the cutting machining of iron-based materials because of the high solubility of carbon in iron, resulting in high diffusion wear even at moderate temperatures.

Cutting edges (cutting tips) composed of PCD or CBN are also very expensive, due to the complicated production of the materials (which are thermodynamically unstable under normal conditions). It is usual to produce fine diamond or CBN powder under very high pressures and at high temperatures (known as "high pressure high temperature" processes, HPHT processes for short), and these are then quenched and subsequently sieved. The fine powders are then sintered by various processes.

Furthermore, the production of diamond cutting tips by deposition of a thick film by means of chemical vapor deposition (CVD for short) is known. The tips obtained in this way have, due to the process, a very homogeneous microstructure and can be produced in fine-grained form. However, the deposition rates are low, resulting in long process times. Furthermore, the separation or parting of the tips obtained in this way into individual cutting tips is comparatively complicated.

Apart from cutting tips composed of PCD or CBN, cutting tips made of cemented hard material are customary. These are usually produced by a powder metallurgical route or by sintering, with, for example, WC/Co (tungsten carbide-cobalt, generally known as "cemented carbide") being an important basic material. Indexable inserts are frequently provided with hard, abrasion-resistant, corrosion-resistant and possibly also friction-reducing coatings (known as tribological layers) by means of PVD or CVD in order to reduce wear and/or allow higher cutting speeds and better cut surface qualities. PVD processes include, inter alia, thermal evaporation, electron beam evaporation, pulsed laser deposition (pulsed laser ablation), arc evaporation (frequently: arc-PVD), molecular beam epitaxy, sputtering, ion beam assisted deposition (IBAD) and ion cladding. The powder-metallurgical production of the actual indexable inserts suffers from various disadvantages, and in the case of cemented hard material these are, in particular, the following:

- To achieve the very small grain sizes (of the hard material phase, <0.5 µm) which are desirable with a view to the mechanical wear strength, correspondingly fine-grained starting powders have to be produced at high cost and ideally handled in the absence of oxygen.
- The production of pore-free sintered bodies having a homogeneous microstructure is frequently difficult, does not succeed completely and frequently requires an additional technical operation such as hot isostatic pressing (HIP for short).
- Grain growth frequently occurs during sintering, as a result of which technically desirable grain sizes in the nanometer range cannot be achieved.
- Numerous, highly promising material systems (e.g. alloys), in particular highly heat resistant alloys, cannot be produced, or not be produced economically in massive form because of their high solidus temperatures.
- The production of special textures such as nanometer multilayer systems is impossible using the means of powder metallurgy according to the prior art.

In the following, the term nanocomposites is used to refer to materials which consist of at least two phases which are different (in terms of their structure and/or their physical or chemical properties) and of which at least one is crystalline and has an average grain diameter of less than 100 nm.

In the field of hard material coatings, nanocomposites which consist of one or more nanocrystalline ("nc" for short) nitride phases embedded in an amorphous or X-ray-amorphous ("a" for short) phase have been the subject of research for some years. A prototype of these nanocomposites is the material system nc-TiN/a-$Si_3N_4$, which has excellent penetration hardness, high temperature stability, good chemical resistance and high oxidation resistance and can be produced in a simple way by means of conventional PVD processes (in particular arc-PVD).

The hardness of nanocomposites of this type can be in a range which among conventional cutting materials is the preserve of those based on CBN and PCD. The highest penetration hardnesses are found here when the proportion by volume of the amorphous phase is such that it precipitates predominantly in layers which are only one layer of atoms thick at the grain boundaries of the crystalline phase(s). In this case, the amorphous phase (usually a covalent nitride) is actually not so much amorphous as epitactic.

It is an object of the invention to produce an indexable insert which has a very hard cutting edge but nevertheless has a significantly greater toughness than known, similarly hard cutting edges (e.g. composed of PCD or CBN).

BRIEF SUMMARY OF THE INVENTION

One aspect of the present invention relates to an indexable insert comprising a main element having free surfaces and at least one cutting surface. According to an example of the invention, the cutting surface(s) of the indexable insert but not the free surfaces thereof is (are) coated with a very thick layer (e.g. greater than 50 µm) of a hard material by means of a PVD process. Possible materials for the main element are cemented hard materials, stellites (i.e. cobalt-chromium alloys containing carbides) or high speed steels. As hard material, it is possible to use, for example, a nanocomposite. Particularly good material properties (high toughness combined with high hardness) can be achieved when the constituents of the nanocomposites are deposited in alternating thin (in each case less than 200 nm) layers. Such nanocomposites made up of layers are also referred to as nanolaminates.

A further aspect of the invention relates to a process for producing indexable inserts, which comprises the following steps: provision of a main element having free surfaces and at least one cutting surface; deposition of a thick layer of a hard material on the cutting surface(s) of the main element by means of a PVD process, in particular a thick layer of a nanocomposite, for example a nanolaminate. The free surfaces are, apart from very thin deposits which are undesirable per se, not coated with the thick PVD layer.

For the purposes of the present invention, "thick layers" are layers having a layer thickness of more than 50 µm, in particular more than 100 µm or even more than 200 µm. Thick layers thus have a significantly greater layer thickness than is usually used in the case of coating of surfaces with hard materials.

The indexable inserts obtained in this way can achieve penetration hardnesses similar to those of known PCD or CBN tips, but are significantly cheaper to produce. The PVD processes employed in production of these indexable inserts operate using low process pressures and also temperatures lower than those in HPHT processes employed for the production of PCD or CBN. Furthermore, costly parting of the cutting tips is not necessary and the soldering or sintering of the actual cutting tips onto the main element is dispensed with.

A further advantage is the wide range of available nc/a nanocomposites having different compositions, which makes matching of the cutting material to the material to be machined in terms of chemical compatibility of cutting material and workpiece material possible. In addition, the nanocomposites or nanolaminates produced by means of PVD processes have great toughness due to process-related residual compressive stresses. In contrast thereto, layers produced by means of CVD generally have tensile rather than compressive residual stresses and are therefore more brittle.

PVD nanolaminates in particular can macroscopically be virtually residual stress-free and nevertheless be extraordinarily tough. This is attributable to local compressive stresses which result from imperfect matching between the various layers and prevent the formation of cracks or very effectively suppress their growth.

In addition to the high toughness, indexable inserts according to the abovementioned example of the invention can have an improved hot strength compared to conventional indexable inserts. Even when the temperature is increased to more than 800° C. during a cutting operation, the hardness of the PVD layer which forms the cutting edge barely decreases. As in the case of the known soldered-on CBN or PCD cutting tips, the cutting edges of the indexable inserts, which are according to the invention configured as PVD layers, are virtually self-supporting because of their great layer thickness, as a result of which the demands made of hot strength and hardness of the main element are relatively small. The PVD layer distributes the forces occurring during cutting machining over an area of the main element, as a result of which this experiences only low pressures.

The following figures and the further description are intended to help give a better understanding of the invention. Further details, variants and modifications of the inventive concept are illustrated by means of figures which relate to a specific selected example. The elements in the figures are not to be considered as a restriction, but are instead intended to present the principle of the invention. In the figures, identical reference numerals designate corresponding parts.

BRIEF DESCRIPTION OF THE SEVERAL VIEWS OF THE DRAWING

FIG. 1 shows a schematic cross section (not to scale) through an indexable insert having a structure according to an example of the invention;

FIG. 2 shows a schematic plan view (not to scale) of an arrangement for the PVD coating of indexable insert main elements arranged on a rotating workpiece support;

FIG. 3 shows an enlarged and detailed view of a section of FIG. 2; and

FIG. 4 shows the indexable inserts of FIG. 1 in various stages of a production process according to an example of the invention.

DETAILED DESCRIPTION OF THE INVENTION

According to an example of the invention, the cutting surface(s) of an indexable insert, but not its free surfaces, is (are) coated by means of a PVD process with a very thick layer (e.g. greater than 50 µm) of a hard material. Conventional materials, e.g. cemented hard materials, stellites or high speed steels, can be used as material for the main element.

FIG. 1 illustrates an indexable insert 10 according to an example of the invention, with a plan view being shown in FIG. 1b and a corresponding sectional view being shown in FIG. 1a. In the present example, the indexable insert 10 has a cuboidal main element 11 composed of cemented hard material (e.g. WC/Co) for the cutting tips. The main element has a square base area (side length, for example, 12.7 mm) and a height (thickness) which is significantly less than the side length of the base area (e.g. 3.18 mm) and also a central hole which widens in the direction of the upper side. The dimensions of the indexable inserts are frequently standardized. The basic shape can consequently also differ from the depiction selected in FIG. 1. In particular, indexable inserts having a triangular base area and indexable inserts without a hole are also known.

As mentioned at the outset, conventional indexable inserts frequently have cutting edges (cutting tips) composed of hard materials (e.g. CBN) which are produced in a complicated manner and subsequently have to be soldered or sintered (sinter fusing) onto the main element. In contrast thereto, in the case of the indexable insert 10 depicted in FIG. 1, a thick PVD layer 12 composed of a hard material is arranged on a cutting surface of the main element 11. The free surfaces of the main element 11 do not have a thick PVD layer 12. PVD layers are referred to as thick when they are significantly thicker than conventional coatings of cutting edges. The lower limit for the thickness of a thick PVD layer 12 can be said to be 50 µm; in the present example, the thickness of the PVD layer 12 which forms the cutting edge of the indexable insert 10 is about 200 µm. The main element 11 composed of cemented hard material can optionally be (at least partially) coated with a bonding layer 13 (e.g. of chromium nitride or zirconium nitride). This layer 13 has a thickness of about 4 µm and is therefore significantly thinner than the thick PVD layer 12 and can also be arranged on the free surfaces of the main element.

In the example of FIG. 1, the "free surfaces" of the main element are the side faces of the cuboidal main element 11 and also its underside. The "cutting surface" is the upper side of the main element 11. In the case of a main element having a triangular base area, too, its upper side can be referred to as cutting surface and the three side faces and the underside can be referred to as free surfaces. In general, the cutting surface is any surface of a main element which bears the cutting edge or the cutting tip.

The following description is concerned essentially with the material of the thick PVD layer 12 and its internal structure. For example, FIG. 1c shows the PVD layer 12 of FIG. 1a as a stack of a plurality of alternating nanolayers having thicknesses in the lower nanometer range. This is followed by a discussion of a production process according to an example of the invention.

As PVD processes for coating the cutting surface of a main element of an indexable insert, it is possible to use, for example arc evaporation (arc-PVD). After deposition, the hard material can, according to an example of the invention, be present entirely or predominantly in nanocrystalline form. The crystallization is dependent, in particular, on the process parameters (bias voltage, process pressure and temperature) of the PVD process used and can be determined experimentally as a function of the material used.

Nanocomposite: A particularly hard and at the same time tough layer can be achieved when the deposited hard material layer is a nanocomposite which can consist entirely or predominantly of nitrides. In particular, the nanocomposite can consist predominantly of at least one crystalline phase and of at least one amorphous or epitactic phase. The molar proportion of the amorphous or epitactic phase(s) is, for example, in the range from 2 mol % to 20 mol %. The crystalline phase(s) is (are) formed, for example, by one or more crystalline nitrides. In particular, the crystalline phase(s) can consist entirely or predominantly of TiN, ZrN, HfN, TaN or CrN and the amorphous or epitactic phase(s) can consist entirely or predominantly of silicon nitride ($Si_3N_4$) and/or boron nitride (BN). In crystalline phases, the above-mentioned materials (TiN, ZrN, HfN, TaN or CrN) can also be present as alloy with aluminum nitride (e.g. TiN—AlN and CrN—AlN). The nanocrystalline phases (e.g. nc-CrN) are effectively embedded in a matrix of amorphous or epitactic silicon nitride (a-$Si_3N_4$ matrix) or boron nitride.

Nanolaminate: Good material properties (high toughness combined with high hardness) of the indexable insert can be achieved when the nanocomposites and/or their components are deposited alternately in thin layers (e.g. in each case thinner than 200 nm, in particular thinner than 100 nm). Such nanocomposites made up of different layers are also referred to as nanolaminates. For example, a nanolaminate can be formed by a (nanocrystalline) nitride layer consisting of TiN, ZrN, HfN, TaN, CrN or an alloy of at least two of the abovementioned materials and a nanocomposite layer as described above being deposited alternately. The nitride layers have a thickness of, for example, from 5 nm to 20 nm, and the nanocomposite layers have a thickness of, for example, from 20 nm to 60 nm.

Particularly good material properties of the indexable insert can be achieved using nanolaminates which have alternate nitride layers and nanocomposite layers. The nitride layers consist, for example, entirely or predominantly of nanocrystalline titanium nitride (nc-TiN) and the nanocomposite layers consist entirely or predominantly of a matrix of amorphous (or epitactic) silicon nitride in which a nanocrystalline aluminum nitride-chromium-nitride solution (e.g. nc-(AlN—CrN)/a-$Si_3N_4$) is embedded. As mentioned above, the molar proportion of the amorphous/epitactic $Si_3N_4$ is in the range from 2 mol % to 20 mol %.

In experiments, it has been found that the properties of the nanolaminate are better when the nanocrystalline phases of the nanocomposite (in the above example nc-AlN—CrN) ideally do not contain any phase having a hexagonal crystal structure. Consequently, quite generally and not only in the case of nanolaminates, exclusively crystallites having a cubic structure are desirable in the nanocomposite. To achieve a good crystal structure in this sense, the process parameters (temperature, pressure and bias voltage) of the PVD coating process and also the proportions of alloy in the nanocrystalline phase of the composite (AlN and CrN in the above example) can be set so that very few (best of all no) crystallites having a hexagonal structure are formed in the composite. Depending on the specific materials used, the optimal process conditions and alloying ratios can be determined experimentally. In the present example of a nanolaminate having alternating nitride layers composed of nc-TiN and nanocomposite layers composed of nc-(AlN—CrN)/a-$Si_3N_4$, very high penetration hardnesses and high toughness were achieved when the proportion of AlN in the AlN—CrN solution is just sufficiently high for hexagonal crystal structures not to be formed (yet) but cubic crystal structures to be formed virtually exclusively instead. A higher proportion of AlN would result in an appreciable proportion of hexagonal crystallites, and the material would become brittle. According to experiments, the above condition is satisfied at a ratio of 70 mol % of AlN to 30 mol % of CrN and the resulting nanolaminate is particularly hard and tough. In addition, the high proportion of AlN results in a low coefficient of thermal expansion combined with a high thermal conductivity of the nanolaminate.

Nanolaminate coatings deposited according to an example of the invention and having layers composed of nc-AlN—CrN and TiN have only small macroscopic residual stresses and are very tough and smooth. If the nc-AlN—CrN solution is embedded in a a-$Si_3N_4$ matrix, the hardness of the nanolaminate layer increases very greatly without losing toughness. Good material properties are obtained at a proportion of from 2 mol % to 10 mol % of a-$Si_3N_4$ in the nc-(AlN—CrN)/a-$Si_3N_4$ nanocomposite layer, in particular at 5 mol %. The thickness of the nc-TiN nitride layers is in the range from 5 nm to 20 nm, and the thickness of the nc-(AlN—CrN)/a-$Si_3N_4$ nanocomposite layers is in the range from 40 nm to 60 nm. Such nanolaminates are electrically conductive and can, if required, be machined by spark erosion.

As indicated above, indexable inserts having extremely hard and nevertheless tough cutting edges can be produced by deposition of hard materials in the form of nanolaminates on a cutting surface of a main element of a cutting tip. To increase the toughness further and to match the (macroscopic) coefficient of thermal expansion to that of the main element of the cutting tip, further layers (intermediate layers) composed of other materials, in particular further layers composed of silicon nitride and/or of metals which do not form stable nitrides can be inserted between the layers of the above-described nanolaminate. The thickness of these intermediate layers is, for example, from 5 nm to 200 nm. The proportion by volume of the further layers of the total coating deposited is, for example, less than or equal to 50%. The intermediate layers separate the stack composed of a plurality of nanolayers (layers composed of nc-TiN and nc-(AlN—CrN)/a-$Si_3N_4$) having a total thickness of, for example, from 1 µm to 3 µm. Good results were achieved using laminate stacks having thicknesses of about 2 µm and metallic intermediate layers having thicknesses of about 10 nm located in between.

As stated, the further layers (intermediate layers) can be formed by deposition of metals which do not form nitrides or alloys of such metals. Possibilities here are, for example, ferrous metals (i.e. iron, cobalt and/or nickel) and rhenium and also alloys thereof. Furthermore, nickel-cobalt alloys are suitable as material for producing the intermediate layers, in particular an alloy having approximately equal proportions (mol %) of cobalt and nickel, optionally with a proportion of rhenium of from 2 mol % to 12 mol %. In addition or as an alternative, the nickel-cobalt alloy can contain up to 2 mol % of a nitride-forming transition metal (in the form of nitride), where the nitride-forming transition metal serves to reduce the grain size. As an alternative, the intermediate layers can be produced by deposition of textured layers composed of (nanocrystalline) silicon nitride, which results not only in increasing the toughness but also in an improvement in the temperature-change resistance (by reducing the macroscopic coefficient of thermal expansion). The increase in the toughness is in this case not as great as in the case of metallic intermediate layers, but the adhesion wear during machining of low-alloy steels is lower.

Regardless of the choice of the material for the intermediate layers, varying the ratio of the thickness of the intermediate layers to the thickness of the following nanolaminate stack enables the coefficient of thermal expansion to be adapted pseudocontinuously over the total thickness of the deposited coating. On the side of the deposited coating facing the main element of the cutting tip, the proportion by volume of the intermediate layers should be made the highest, with the proportion by volume decreasing with increasing distance from the main element.

An indexable insert having a structure according to one of the above-described examples of the invention can, after deposition of the thick PVD layer, be coated in a manner known per se with a thin (compared to the thick PVD layer) tribological layer or a hard material. The term tribological layers generally refers to all layers which reduce abrasive wear. This coating can also be applied to the free surfaces of the indexable insert, in contrast to the thick PVD layer which is composed of nanocomposite or nanolaminate and forms the cutting edge. The thickness of such tribological layers is usually from about 1 µm to 12 µm.

In addition or as an alternative, the main element of the cutting tips can be coated with a known hard material before deposition of the thick PVD layer which forms the cutting edge. This additional layer is thinner than the thick PVD layer which is subsequently deposited on this additional layer. The additional layer can perform the function of a bonding layer. For this purpose, a bonding layer, which consists, for example, entirely or partially of chromium nitride (CrN), titanium nitride (TiN) or zirconium nitride (ZrN) or a corresponding alloy, can be applied to the main element before deposition of the thick PVD layer. The presence of bonding layers and tribological layers is not restricted to the examples which concern cutting tips composed of nanolaminate.

sp$^3$-hybridized carbon: As an alternative to the above-described nanocomposite or nanolaminate, sp$^3$-hybridized carbon or sp$^3$-hybridized boron nitride which can, for example, be deposited in thick layers on the cutting surface of a main element of a cutting tip by means of filtered arc evaporation (arc-PVD) or cathode sputtering is also suitable, for example, as hard material. In contrast to known CVD layers, such thick layers (e.g. thickness greater than 50 µm) are less brittle and do not have to be parted and soldered on (or sintered on).

The degree of hybridization can be altered periodically during deposition, for example by modulating the bias voltage. This forms a laminate composed of a plurality of layers having layer thicknesses in the nanometer range and having different degrees of hybridization, with at least one layer being entirely or predominantly sp$^3$-hybridized. Such a laminate can be referred to as nanolaminate. Another type of nanolaminate is described further below. It is also possible to deposit carbon and boron nitride (as nanolaminate or as thick single layer). In this case, good results are achieved when at least one phase is entirely or predominantly sp$^3$-hybridized. Intermediate layers, in particular layers composed of metals and alloys which do not form stable nitrides or carbides, can be inserted between the individual layers. As regards the intermediate layers, what has been said above in respect of the nanocomposite-nanolaminate also applies here. Such indexable inserts are particularly suitable for milling or turning of titanium and titanium alloys (e.g. TiAl$_4$V$_6$).

Various aspects of a process for producing the indexable inserts described above and sketched in FIG. 1 are explained below with reference to FIGS. 2 to 4. According to an example of the invention, a process for producing indexable inserts 10 comprises the following steps: provision of one or more main elements 11 having free surfaces and in each case a cutting surface; deposition of a thick layer 12 composed of a hard material by means of a PVD process, in particular a thick layer composed of a nanocomposite, for example a nanolaminate. As indicated above, thick PVD layers are layers having thicknesses of at least 50 µm, typically 200 µm or more.

FIG. 2 illustrates, in a schematic depiction, a plan view into the interior of a PVD process chamber. A rotatable workpiece support 32 is arranged at a central position in the middle of the chamber (axis of rotation 33). In the present example, a cross section (normal to the axis of rotation 33) through the workpiece holder 32 has an octagonal contour, but other shapes are also possible. Around the workpiece support 32, there are a plurality of evaporators 35, 36 (in some PVD processes, also referred to as "targets"); in the present example, four evaporators are provided and are each offset by 90° around the axis of rotation 33, each at the same distance from the axis of rotation.

Two evaporators opposite one another are each configured so as to make available a particular material to be deposited. In the example in FIG. 2, the evaporators 36 comprise an alloy of aluminum, chromium and silicon which reacts in the nitrogen atmosphere of the PVD process chamber 30 to form corresponding nitrides which are deposited as nanocomposite nc-(AlN—CrN)/a-Si$_3$N$_4$ on the cutting surfaces of the indexable insert main element 11 mounted on the outer surface of the workpiece support 33. In a similar way, the evaporators 35 comprise titanium which react in the nitrogen atmosphere of the PVD process chamber 30 to form titanium nitride which is, as described above, deposited as nc-TiN on the main element 11 of the indexable inserts.

As has been mentioned above, it is desirable for the nanocrystalline phases of the TiN layers and/or the nanocomposite layers to ideally have exclusively crystallites having a cubic crystal structure and hexagonal crystal structures should be avoided. To achieve this, the process parameters of the PVD process, in particular the pressure and the temperature of the nitrogen atmosphere and also the bias voltage $V_{BIAS}$ of the workpiece support 33 (and thus the main element 11), can be set so that no hexagonal crystal structures are formed in the PVD layer. The optimal parameters can be determined experimentally. In a similar way, the alloying ratio of the Al—Cr—Si evaporators 36 can be adapted so that hexagonal crystal structures are just not formed in the PVD layer. When the proportion of aluminum is gradually increased, the crystals become hexagonal above a certain critical proportion of aluminum. Good material properties were achieved when the alloying ratio is selected close to this point, but without permitting hexagonal crystal structures.

In the present example, an arc-PVD process was used, the pressures in the interior of the process chamber 30 were in the range from 1 Pa to 10 Pa, the process chamber is earthed and the bias voltage of the workpiece support is in the range from −80 V to −900 V, in particular −400 V.

FIG. 3 shows an enlarged and detailed section of FIG. 2, namely the workpiece support 32 including mounted main elements 11 of indexable inserts and one of the evaporators 36. PVD processes in principle have, under suitable process conditions (temperature, pressure, bias voltage, etc), a preferential deposition direction, i.e. the PVD layer "grows" to a greater extent along the "line of view" from the evaporator to the axis of rotation 33 of the workpiece support than in other directions. For the free surfaces of the main element 11 (apart from undesirable deposits) to be ideally not coated, the individual main elements are mounted at only a small distance from one another in a depression in a plane (parallel to the axis of rotation 33) which is set back relative to the outer contour 37 of the workpiece support 32. This small spacing is slightly greater than the desired layer thickness of the PVD layer, e.g. not more than 50% greater than twice the desired layer thickness. The main elements arranged directly at the edge of the depression are likewise not further removed from this edge than the main elements are away from one another.

FIG. 4 summarizes by way of example important aspects of the production process in the diagrams (a) to (e). FIG. 4a shows a plurality of main elements 11 of indexable inserts in a regular, closely spaced arrangement, in the way in which they are arranged, for example, on a workpiece support before PVD coating. The close spacing prevents larger deposits on the side faces (free surfaces) of the main elements 11.

FIG. 4b shows a cross section of an indexable insert 10 having a main element 11 and a PVD layer 12 deposited thereon, with slight deposits 12' (a few μm thick) being present on the side faces. Not only to remove these deposits 12' but also to give the (cutting) edges of the indexable insert a defined shape, the free surfaces of the main elements 11 can be ground. FIG. 4c shows the indexable insert 10 of FIG. 4b after grinding of the free surfaces. FIG. 4d shows a corresponding plan view. As a result of grinding, the lateral edges have obtained a defined radius and the PVD layer 12 has obtained a sharp cutting edge along its upper longitudinal edge.

The indexable insert can subsequently be, as mentioned above, coated entirely or partly with a tribological layer. The main element can optionally be coated with a bonding layer before deposition of the PVD layer (cf. layer 13 in FIG. 1).

The above-described aspects of the production process are independent of the specific shape of the main element and the specific composition of the PVD layer.

The invention claimed is:

1. An indexable insert, comprising:
a main element having free surfaces and at least one cutting surface; at least one cutting surface of the main element but not its free surfaces being coated by a PVD process with a PVD layer composed of a hard material and having a layer thickness greater than 50 μm;
the hard material being a nanolaminate including a plurality of different layers being, in particular, composed of different nitrides; and
individual layers of the nanolaminate including nitrides, in particular the nanolaminate having layers including one or more nanocrystalline nitrides and layers including at least one of silicon nitride or boron nitride and being entirely or partially present in at least one of amorphous or epitactic form.

2. The indexable insert as claimed in claim 1, wherein the layer thickness of the PVD layer is greater than 100 μm.

3. The indexable insert as claimed in claim 1, wherein the hard material in the PVD layer is entirely or predominantly nanocrystalline.

4. The indexable insert as claimed in claim 1, wherein the hard material is a nanocomposite which is composed entirely or predominantly of nitrides.

5. The indexable inserts as claimed in claim 4, wherein the nanocomposite comprises
at least one nanocrystalline phase consisting entirely or predominantly of one or more crystalline nitrides; and
at least one of at least one amorphous or epitactic phase which consists entirely or predominantly of at least one of silicon nitride or boron nitride and has a proportion in the nanocomposite of from 2 mol % to 20 mol %.

6. The indexable insert as claimed in claim 5, wherein the at least one crystalline phase consists entirely or predominantly of TiN, ZrN, HfN, TaN or CrN or an alloy of at least one of the nitrides mentioned with AlN.

7. The indexable insert as claimed in claim 1, wherein the nanolaminate has alternating nitride layers and nanocomposite layers, where:
a nitride layer has a nitride selected from among TiN, ZrN, HfN, TaN, CrN and alloys of one of the above-mentioned nitrides with a different nitride and
a nanocomposite layer consists of a nanocomposite, where the nanocomposite comprises at least one nanocrystalline phase consisting entirely or predominantly of one or more crystalline nitrides, and
at least one of at least one amorphous or epitactic phase which consists entirely or predominantly of at least one of silicon nitride or boron nitride and has a proportion in the nanocomposite of from 2 mol % to 20 mol %.

8. The indexable insert as claimed in claim 7, wherein the nitride layers are from 5 nm to 20 nm thick and the nanocomposite layers are from 20 nm to 60 nm thick.

9. The indexable insert as claimed in claim 7, wherein
the nitride layers consist entirely or predominantly of titanium nitride and
the nanocomposite layers consist entirely or predominantly of nc-(AlN-CrN) /a-$Si_3N_4$ comprising from 2 mol % to 20 mol % of $Si_3N_4$.

10. The indexable insert as claimed in claim 9, wherein there is ideally no hexagonal phase in the nanocomposite but instead the nanocomposite consists entirely or predominantly of crystallites of a cubic AlN-CrN solution which are embedded in a matrix of at least one of amorphous or epitactic $Si_3N_4$.

11. The indexable insert as claimed in claim 1, wherein additional layers are arranged as intermediate layers in the nanolaminate, where the proportion by volume of these layers is equal to or less than 50%.

12. The indexable insert as claimed in claim 11, wherein the intermediate layers consist entirely or predominantly
of $Si_3N_4$ or
of metals which do not form nitrides.

13. The indexable insert as claimed in claim 11, wherein the intermediate layers consist of iron, cobalt, nickel, rhenium or an alloy of two or more of the metals mentioned.

14. The indexable insert as claimed in claim 11, wherein the intermediate layers consist of a nickel-cobalt alloy.

15. The indexable insert as claimed in claim 14, wherein from 2 mol % to 12 mol % of rhenium is added to the nickel-cobalt alloy.

16. The indexable insert as claimed in claim 15, wherein up to 2 mol % of a nitride-forming transition metal is added in the form of a nitride to the nickel-cobalt-rhenium alloy.

17. The indexable insert as claimed in claim 11, wherein the ratio of the thickness of the intermediate layers to the thickness of the nitride layers or nanocomposite layers is variable perpendicular to a layer plane of the PVD layer, so that the coefficient of thermal expansion of the PVD layer varies correspondingly perpendicular to the layer plane.

18. The indexable insert as claimed in claim 11, wherein the ratio of the thickness of the intermediate layers to the thickness of the nitride layers or nanocomposite layers is variable perpendicular to a layer plane of the PVD layer, where the proportion by volume of the intermediate layers is greatest on the side facing the main element and smallest on the side facing away.

19. The indexable insert as claimed in claim 1, wherein the indexable insert including the PVD layer is additionally entirely or partly coated with at least one tribological layer.

20. The indexable insert as claimed in claim 19, wherein the free surfaces of the main element are also coated.

21. The indexable insert as claimed in claim 1, wherein an additional layer composed of hard material is arranged between the main element and the PVD layer.

22. The indexable insert as claimed in claim 21, wherein the additional layer consists of such a material that it acts as bonding layer between the PVD layer and the main element.

23. The indexable insert as claimed in claim 22, wherein the additional coating consists entirely or partially of CrN.

24. The indexable insert as claimed in claim 1, wherein the hard material of the PVD layer consists of entirely or predominantly at least one of $sp^3$-hybridized carbon or $sp^3$-hybridized boron nitride.

25. The indexable insert as claimed in claim 24, wherein the PVD layer is composed of a nanolaminate comprising a plurality of layers in which at least one of carbon or boron nitride of differing degrees of hybridization is present, in particular with at least one layer being entirely or predominantly $sp^3$-hybridized.

26. The indexable insert as claimed in claim 24, wherein intermediate layers consisting of metals or alloys which do not form at least one of stable nitrides or carbides are arranged between the layers of the nanolaminate.

27. A process for producing indexable inserts, which comprises the following steps:
provision of cutting tip main elements having free surfaces and in each case at least one cutting surface;
deposition of a thick layer having a thickness of at least 50μm and being composed of a hard material by carrying out a PVD process onto the cutting surfaces of the main elements, in particular of a thick layer composed of a nanocomposite; and
placing indexable inserts on a workpiece support being rotatable about an axis of rotation in a PVD process chamber before deposition of the PVD layer.

28. The process as claimed in claim 27, wherein deposition is carried out until the PVD layer has a thickness of greater than 100 μm.

29. The process as claimed in claim 27, wherein
the main elements are arranged in a PVD process chamber having at least one evaporator source during deposition of the PVD layer and
the main elements are arranged relative to the evaporator source or to one of the evaporator sources in such a way that virtually exclusively the cutting surfaces of the main elements are coated.

30. The process as claimed in claim 27, which further comprises:
rotation of the workpiece support during the deposition process in such a way that the main elements arranged on the workpiece support are moved past the at least one evaporator source a plurality of times.

31. The process as claimed in claim 27, wherein two or more evaporator sources composed of different material are arranged at various positions around the axis of rotation of the workpiece support and the process further comprises:
rotation of the workpiece support during the deposition process in such a way that the main elements arranged on the workpiece support are alternately moved past various evaporator sources a plurality of times, so that layers of different material are deposited alternately on the main elements.

32. The process as claimed in claim 30, wherein the deposition of the PVD layer is carried out in a nitrogen atmosphere and at a pressure and a temperature at which the material vaporized from the evaporator source(s) reacts in the nitrogen atmosphere to form nitride(s) which is (are) deposited on the cutting surface of the main element.

33. The process as claimed in claim 31, wherein the workpiece support is rotated in such a way that the PVD layer is deposited in the form of a nanolaminate which has a plurality of different layers.

34. The process as claimed in claim 33, wherein the individual layers comprise nitrides and the hard material is in the form of a nanolaminate which comprises a plurality of different layers which are, in particular, composed of different nitrides.

35. The process as claimed in claim 33, wherein at least one of carbon or boron nitride are deposited in such a way that the carbon or the boron nitride has different degrees of hybridization in different layers of the nanolaminate.

36. The process as claimed in claim 35, wherein the different degrees of hybridization in the individual layers of the nanolaminate is achieved by variation of a bias voltage of the workpiece support during rotation of the workpiece container and the hard material of the PVD layer consists of entirely or predominantly at least one of $sp^3$-hybridized carbon or $sp^3$-hybridized boron nitride.

37. The process as claimed in claim 27, wherein the main element is ground on its free surfaces after deposition of the PVD layer in order to remove any deposits due to the PVD coating process.

38. The process as claimed in claim 27, wherein the indexable insert is coated with a tribological layer after deposition of the PVD layer.

39. The process as claimed in claim 27, wherein the main element is at least partly coated with a bonding layer, in particular a layer composed of CrN, ZrN, TiN or an alloy of the abovementioned materials, before deposition of the PVD layer, whereupon the deposition of the PVD layer on the bonding layer is carried out.

40. The process as claimed in claim 27, wherein the workpiece support has, on its outside, depressions in which the indexable insert main elements are arranged in such a way that ideally no material is deposited on the free surfaces during the PVD process.

41. The process as claimed in claim 27, wherein the process parameters, in particular temperature, pressure of the atmosphere and bias voltage, are set in such a way that ideally no hexagonal crystallites but instead exclusively cubic crystallites are formed in the crystalline phases in the PVD layer.

42. A process for producing indexable inserts, which comprises the following steps:
provision of cutting tip main elements having free surfaces and in each case at least one cutting surface;
deposition of a thick layer having a thickness of at least 50μm and being composed of a hard material by carrying out a PVD process onto the cutting surfaces of the main elements, in particular of a thick layer composed of a nanocomposite;
the hard material being a nanolaminate including a plurality of different layers being, in particular, composed of different nitrides; and
individual layers of the nanolaminate including nitrides, in particular the nanolaminate having layers including one or more nanocrystalline nitrides and layers including at least one of silicon nitride or boron nitride and being entirely or partially present in at least one of amorphous or epitactic form.

\* \* \* \* \*